US006973365B1

(12) United States Patent
Mercanzini

(10) Patent No.: US 6,973,365 B1
(45) Date of Patent: Dec. 6, 2005

(54) SYSTEM AND METHOD FOR HANDLING MICROCOMPONENT PARTS FOR PERFORMING ASSEMBLY OF MICRO-DEVICES

(75) Inventor: Andre L. Mercanzini, Toronto (CA)

(73) Assignee: Zyvex Corporation, Richardson, TX (US)

( * ) Notice: Subject to any disclaimer, the term of this patent is extended or adjusted under 35 U.S.C. 154(b) by 626 days.

(21) Appl. No.: 10/034,495

(22) Filed: Dec. 28, 2001

(51) Int. Cl.$^7$ .............................................. G06F 19/00
(52) U.S. Cl. ............................... 700/120; 310/40 MM
(58) Field of Search ................... 700/127; 310/40 MM

(56) References Cited

U.S. PATENT DOCUMENTS

| | | | |
|---|---|---|---|
| 4,740,410 A | 4/1988 | Muller et al. | |
| 5,493,156 A * | 2/1996 | Okada | ................... 310/40 MM |
| 5,645,684 A | 7/1997 | Keller | |
| 5,660,680 A | 8/1997 | Keller | |
| 5,914,801 A | 6/1999 | Dhuler et al. | |
| 5,962,949 A | 10/1999 | Dhuler et al. | |
| 6,137,206 A | 10/2000 | Hill | |
| 6,359,718 B1 * | 3/2002 | Lin et al. | ..................... 359/224 |
| 6,694,071 B2 * | 2/2004 | Hsu | ............................ 385/16 |
| 6,711,318 B2 * | 3/2004 | Hamerly et al. | .............. 385/18 |

OTHER PUBLICATIONS

U.S. Appl. No. 09/616,500, Matthew D. Ellis et al.
U.S. Appl. No. 09/569,330, Ralph C. Merkle.
Fan, Li et al., *Self-Assembled Microactuated XYZ stages for Optical Scanning and Alignment*, 1997 International Conference on Solid-State Sensors and Actuators, Chicago, Jun. 16-19, 1997, pp. 319-322.

Akiyama, Terunobu et al., *Scratch Drive Actuator with Mechanical Links for Self-Assembly of Three-Dimensional MEMS*, Journal of Microelectromechanical Systems, vol. 6, No. 1, Mar. 1997, pp. 10-17.

Linderman, Ryan J. et al., *Optimized Scratch Drive Actuator for Tethered Nanometer Positioning of Chip-Sized Components*, Solid-State Sensor and Actuator Workshop, NSF Center for Advanced Manufacturing and Packaging of Microwave, Optical, and Digital Electronics, University of Colorado at Boulder, CO.

Ebefors, Thorbjorn, thesis entitled *Polyimide V-Groove Joints for Three-Dimensional Silicon Transducers—exemplified through 30D turbulent gas flow sensor and micro-robotic devices*, Chapter 3, p. 24. figures a) and b).

(Continued)

*Primary Examiner*—Albert W. Paladini
(74) *Attorney, Agent, or Firm*—Haynes and Boone, LLP

(57) ABSTRACT

A system and method are disclosed in which a substrate includes a plurality of functional sites, wherein each site comprises a micro-device for handling microcomponent parts. For instance, in a preferred embodiment, functional sites are included on a substrate for at least performing rotational tasks. That is, in a preferred embodiment, a plurality of functional sites are included on a substrate, wherein each functional site comprises a micro-device for handling a microcomponent part presented thereto to perform rotation of the part in some manner. The plurality of micro-devices may be operable to rotate a microcomponent part about various different axes of rotation. For instance, in one embodiment, full rotational handling (rotation about all three axes of a three-dimensional coordinate system) may be provided by the micro-devices.

34 Claims, 8 Drawing Sheets

OTHER PUBLICATIONS

Reid, J. Robert et al., "Automated Assembly of Flip-Up Micromirrors," *Transducers* '97, 1997, 347-350 Int'l Conf. on Solid-State Sensors and Actuators, Chicago, Jun. 16-19.

Luntz, Jonathan E. et al., "Closed-Loop Operation of Actuator Arrays," *IEEE* 2000 Int'l Conf. Robotics and Automation, San Francisco, Apr. 3666-3672.

Suh, John W. et al., "Organic thermal and electrostatic ciliary microactuator array for object manipulation," *Sensors and Actuators* A 58 1977 51-60.

Bohringer, Karl-Friedrich et al., "Vector Fields for Task-level Distributed Manipulation: Experiments with Organic Micro Actuator Arrays," *IEEE* 1997 1779-1786 Int'l Conf. Robotics and Automation, Albuquerque.

Bohringer, Karl-Friedrich et al., "Single-Crystal Silicon Actuator Arrays for Micro Manipulation Tasks," *IEEE* 1996.

Liu, Wenheng et al., "Parts Manipulation on an Intelligent Motion Surface," *IEEE* 1995.

\* cited by examiner

| PART PRESENTED PARALLEL TO X-Y PLANE | PART PRESENTED PARALLEL TO X-Z PLANE | PART PRESENTED PARALLEL TO Y-Z PLANE |
|---|---|---|
| $+\theta$ | $+\theta$ | $+\theta$ |
| $-\theta$ | $-\theta$ | $-\theta$ |
| $+\phi$ | $+\phi$ | $+\phi$ |
| $-\phi$ | $-\phi$ | $-\phi$ |
| $+\psi$ | $+\psi$ | $+\psi$ |
| $-\psi$ | $-\psi$ | $-\psi$ |
*FIG. 2B*
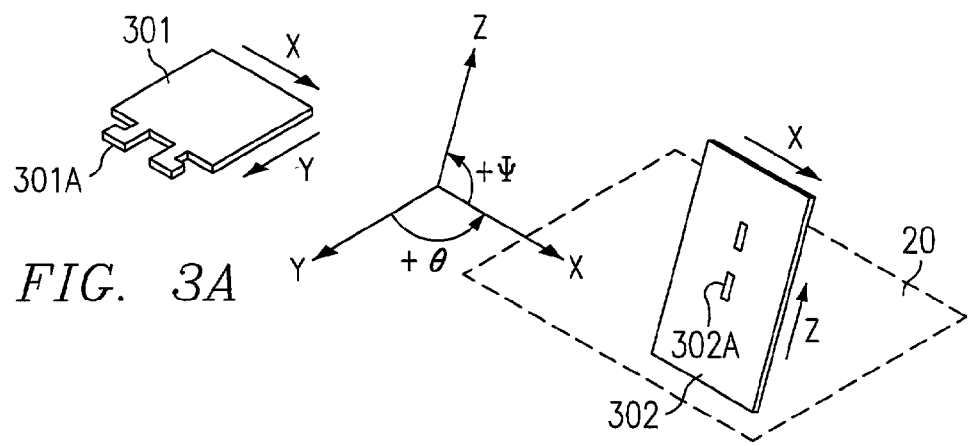
*FIG. 3A*
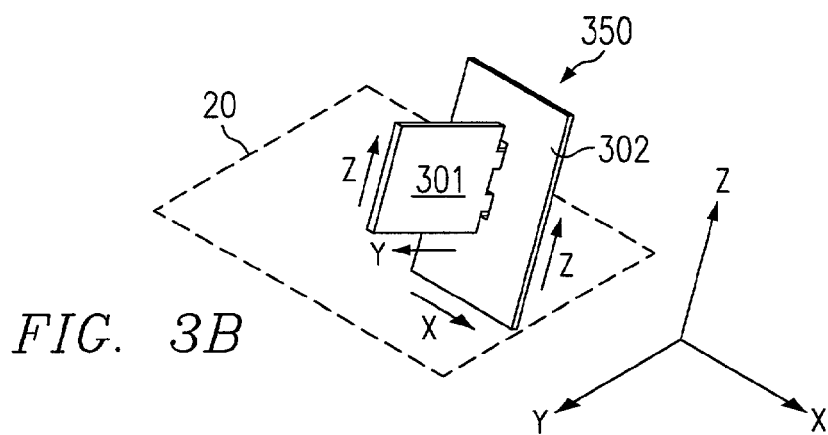
*FIG. 3B*

SYSTEM AND METHOD FOR HANDLING MICROCOMPONENT PARTS FOR PERFORMING ASSEMBLY OF MICRO-DEVICES

CROSS-REFERENCE TO RELATED APPLICATIONS

This application is related to the following and commonly assigned U.S. patent applications: Ser. No. 09/569,330, entitled "METHOD AND SYSTEM FOR SELF-REPLICATING MANUFACTURING STATIONS," filed May 11, 2000, now issued as U.S. Pat. No. 6,510,359; Ser. No. 09/570,170, entitled "SYSTEM AND METHOD FOR COUPLING MICROCOMPONENTS," filed May 11, 2000, now issued as U.S. Pat. No. 6,672,795; Ser. No. 09/569,329, entitled "GRIPPER AND COMPLEMENTARY HANDLE FOR USE WITH MICROCOMPONENTS," filed May 11, 2000, now issued as U.S. Pat. No. 6,398,280; Ser. No. 09/616,500, entitled "SYSTEM AND METHOD FOR CONSTRAINING TOTALLY RELEASED MICROCOMPONENTS," filed Jul. 14,2000, now issued as U.S. Pat. No. 6,677,225; Ser. No. 09/643,011, entitled "SYSTEM AND METHOD FOR COUPLING MICROCOMPONENTS UTILIZING A PRESSURE FITTING RECEPTACLE," filed Aug. 21, 2000, now issued as U.S. Pat. No. 6,561,725; and Ser. No. 10/033,011, entitled "SYSTEM AND METHOD FOR POSITIONAL MOVEMENT OF MICROCOMPONENTS," filed Dec. 28, 2001, now issued as U.S. Pat. No. 6,745,567; the disclosures of which are hereby incorporated herein by reference.

BACKGROUND OF THE INVENTION

1. Technical Field

The present invention is related to handling of microcomponent parts, and more particularly to a system and method for handling microcomponent parts with micro-devices to perform tasks, such as rotation of microcomponent parts.

2. Background

Extraordinary advances are being made in micromechanical devices and microelectronic devices. Further, advances are being made in MicroElectroMechanical system ("MEMs") devices, which comprise integrated micromechanical and microelectronic devices. The term "microcomponent" will be used herein generically to encompass microelectronic components, micromechanical components, as well as MEMs components. The advances in microcomponent technology have resulted in an increasing number of microcomponent applications. For instance, various microcomponent parts are being fabricated and then assembled together. That is, post-fabrication assembly operations may be performed on microcomponent parts to form devices that may have greater utility.

Accordingly, a need often arises for performing handling tasks for assembling microcomponent parts. For example, a microcomponent part may need to be translated from one position to another position such that the microcomponent part can be presented to another microcomponent part for assembly therewith. As another example, a microcomponent part may need to be rotated in some manner such that it is properly oriented for assembly with another microcomponent part. Because of the small size of microcomponents, handling of them to perform such assembly-related tasks is often complex. For instance, in microassembly the relative importance of the forces that operate is very different from that in the macro world. For example, gravity is usually negligible, while surface adhesion and electrostatic forces dominate. (See e.g., "A survey of sticking effects for micro parts handling," by R. S. Fearing, *IEEE/RSJInt. Workshop on Intelligent Robots and Systems*, 1995; "Hexsil tweezers for teleoperated microassembly," by C. G. Keller and R. T. Howe, *IEEE Micro Electro Mechanical Systems Workshop*, 1997, pp. 72–77; and "Microassembly Technologies for MEMS," by Micheal B. Cohn, Karl F. Böhringer, J. Mark Noworolski, Angad Singh, Chris G. Keller, Ken Y. Goldberg, and Roger T. Howe). Due to scaling effects, forces that are insignificant at the macro scale become dominant at the micro scale (and vice versa). For example, when parts to be handled are less than one millimeter in size, adhesive forces can be significant compared to gravitational forces. These adhesive forces arise primarily from surface tension, van der Waals, and electrostatic attractions and can be a fundamental limitation to handling of microcomponents. Also, relatively precise movement (e.g., translational and/or rotational movement) of a microcomponent part is often required to perform assembly operations. Consider, for example, that in some cases mishandling of a part resulting in misalignment of only a few microns may be unacceptable as the size of the microcomponent part to which the part is to be coupled may be only a few microns in total size, and the portion of the microcomponent part that is to be engaged for coupling may be even smaller. Thus, microcomponent parts present particular difficulty in handling for performing assembly operations.

Traditionally, a high-precision, external robot is utilized for handling of microcomponent parts to perform assembly operations. For instance, a high-precision, external robot having three degrees of translational freedom (i.e., capable of translating along three orthogonal axes X, Y, and Z) and having three degrees of rotational freedom may be used for handling microcomponent parts to perform assembly operations. Linear and rotational stages that can be assembled to form such a high-precision external robot are available from NEWPORT CORPORATION, 1791 Deere Avenue, Irvine, Calif. 92606 (see also http://www.newport.com), including as an example NEWPORT's PM500 Series of stages. However, such external robots are generally very expensive. Additionally, external robots typically perform microcomponent assembly in a serial manner, thereby increasing the amount of time required for manufacturing micro-devices. That is, such robots typically handle one microcomponent part at a time, thereby requiring a serial process for assembling microcomponent parts together.

BRIEF SUMMARY OF THE INVENTION

The present invention is directed to a system and method which provide a plurality of functional sites on a substrate, wherein each site comprises a micro-device for handling microcomponent parts for performing assembly tasks. For instance, in a preferred embodiment, functional sites are included on a substrate (e.g., a wafer) for at least performing rotational tasks. That is, in a preferred embodiment a plurality of functional sites are included on a substrate, wherein each functional site comprises a micro-device for handling a microcomponent part presented thereto to perform rotation of the part in some manner. In one embodiment, a plurality of functional sites are included on a substrate that are each operable to rotate a microcomponent part presented thereto. An external robot operable to provide linear translational movement may then be used to present a microcomponent part to the appropriate functional site to have a rotational task performed on such microcomponent part. Therefore, the external robot is not required to have the complexity of performing rotational operations on a microcomponent part.

According to one embodiment, a plurality of micro-stages (or "functional sites") may be included on a common integrated micro-chip. Each of the micro-stages is operable to perform a particular handling task. For instance, one micro-stage may be operable to rotate a microcomponent part presented thereto any amount from 0 to 90 degrees parallel to the plane of the substrate. Another micro-stage may be operable to flip a microcomponent presented thereto up out of the plane of the substrate. Accordingly, a microcomponent part may be presented to one or more of the micro-stages to have a desired rotational operation performed for orienting the microcomponent part in a desired manner for assembling it with another part. That is, a microcomponent part may be presented to one or more of the micro-stages to have rotational operation(s) performed on such microcomponent part to result in a desired orientation of the microcomponent part for assembling the microcomponent part with another part.

In one embodiment, a system for handling microcomponent parts is disclosed that comprises a substrate comprising a plurality of micro-devices that are each operable to perform a distinct rotational operation for rotating a microcomponent part presented thereto. Further, according to one embodiment, at least one of the micro-devices is operable to perform a rotational operation about an axis of rotation that is different than an axis of rotation about which another of said plurality of micro-devices is operable to perform a rotational operation. As an example, a plane that is parallel to the substrate may be formed by an X axis and a Y axis, and a Z axis may be perpendicular to such plane. The plurality of micro-devices may include micro-devices that are each operable to perform a distinct rotational operation of at least one of the following types: rotation about the Z axis ($\theta$ rotation), rotation about the X axis ($\phi$ rotation), and rotation about the Y axis ($\psi$ rotation). In one implementation, the plurality of micro-devices include micro-devices that (in combination with each other) are operable to perform rotation of a microcomponent part presented thereto about the Z axis ($\theta$ rotation), rotation of the microcomponent part presented thereto about the X axis ($\phi$ rotation), and rotation of the microcomponent part presented thereto about said Y axis ($\psi$ rotation). Thus, in certain implementations, full rotational handling functionality may be provided by the micro-devices arranged on the substrate.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawing, in which:

FIG. 2B shows a table identifying various rotational operations that one or more micro-devices may be included on a substrate in a preferred embodiment to perform;

FIGS. 3A and 3B show an example of a first microcomponent part being handled for assembly with another microcomponent part;

DETAILED DESCRIPTION OF THE INVENTION

Figure 1:
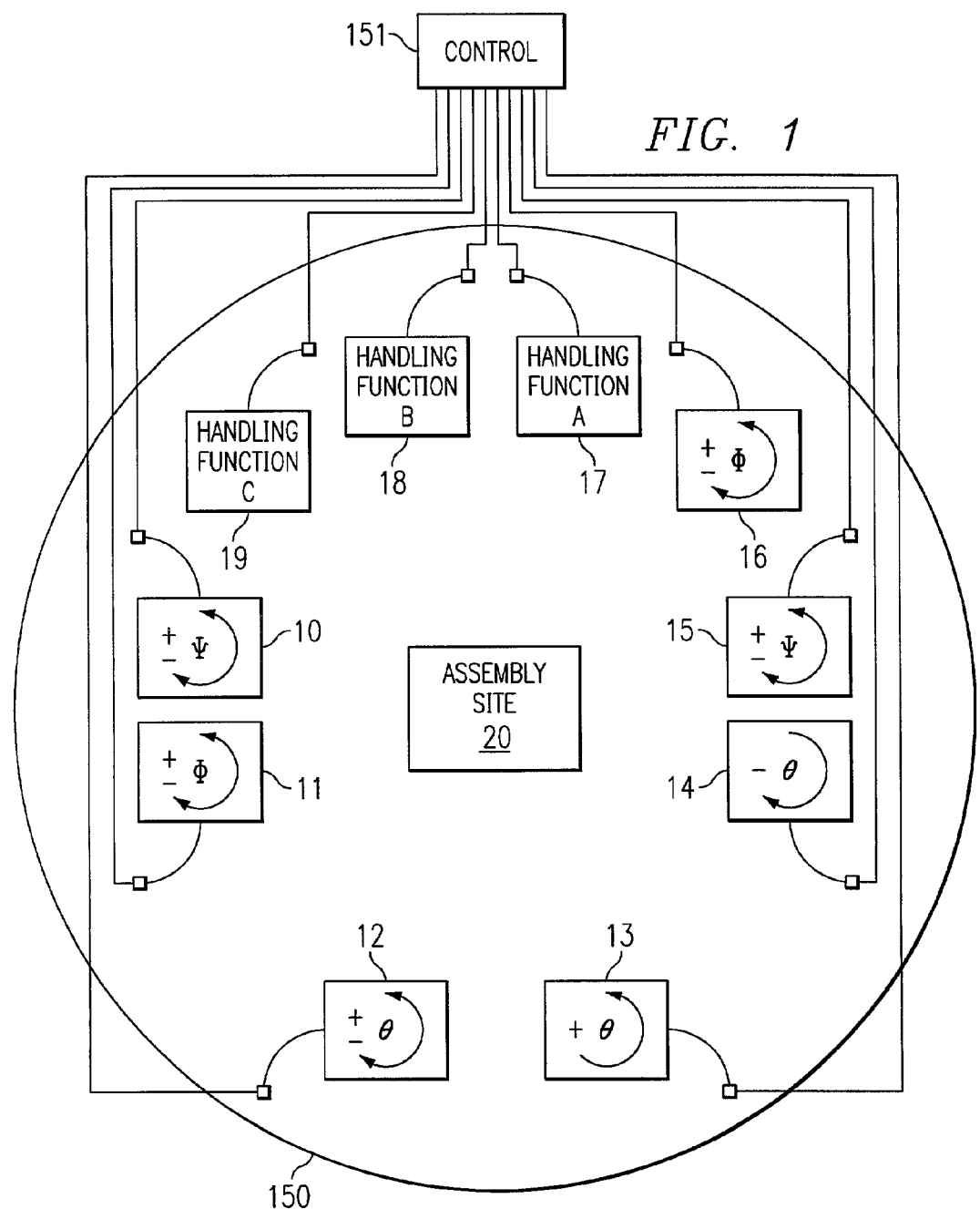
FIG. 1 shows an exemplary substrate of a preferred embodiment that comprises a plurality of functional sites for performing handling tasks on a microcomponent part presented thereto.

Various embodiments of the present invention are now described herein with reference to the above Figs., wherein like reference numerals represent like parts throughout the several views. According to embodiments of the present invention, micro-devices are implemented for performing handling tasks for assembling microcomponent parts together. In performing assembly of microcomponent parts, such handling tasks as rotating a microcomponent part such that it is properly oriented for assembly with another part and/or translation of a microcomponent part, are generally needed. As described above, high-precision external robots (such as those available from NEWPORT CORPORATION) have traditionally been used for performing such handling tasks as rotating microcomponent parts and translating them for performing assembly. By utilizing micro-devices to perform at least some of the handling operations in embodiments of the present invention, less reliance is placed on such an external robot. Thus, in certain implementations, an external robot may not be needed at all for performing assembly. In other implementations, an external robot may be utilized that is less complex than traditional robots used for micro-assembly. For instance, in one embodiment, rotational operations may be performed by micro-devices, thereby alleviating the need for having an external robot perform such rotational operations. Implementing such handling functionality in micro-devices may not only allow for less complexity in an external robot, but may also result in greater efficiency in assembling micro-devices. For instance, many micro-devices may perform handling tasks in parallel, as opposed to the traditional serial handling of microcomponent parts by an external robot.

According to embodiments of the present invention, a plurality of micro-devices each operable to perform a particular handling task may be implemented on a substrate at distinct (or "separate") functional sites. Accordingly, upon needing a particular handling task to be performed on a microcomponent part, the part may be presented to the appropriate functional site capable of performing the particular handling task. For instance, as described further below, one handling task may be to rotate the microcomponent part a given amount. More specifically, the microcomponent part may be rotated about a rotational axis that is orthogonal to the substrate. Thus, at least one functional site may be included on the substrate comprising a micro-device operable to perform such rotation of a microcomponent part presented thereto. Another handling task may be to at least partially "flip" the microcomponent part. More specifically, the microcomponent part may be rotated about a rotational axis that is parallel to the substrate. Thus, at least one functional site may be included on the substrate comprising a micro-device operable to perform such flipping of a microcomponent part presented thereto.

Further, a microcomponent part may be presented to a plurality of different functional sites in a particular sequence in order to achieve a desired handling task. For instance, suppose the above-described functional sites are available on a substrate for rotating a microcomponent part about a rotational axis that is orthogonal to the substrate and for flipping a microcomponent part (or rotating the part about a rotational axis that is parallel to the substrate). Further suppose that it is desired to have a microcomponent part rotated about the orthogonal rotational axis to a particular orientation and then flipped such that the microcomponent part is properly oriented for assembly with another part. The microcomponent part may, therefore, be presented to a first functional site that rotates it about the orthogonal rotational axis to the particular orientation, and it may then be presented to a second functional site that flips the part as desired. Thereafter, the part may be retrieved from the second functional site and assembled with another part.

Moreover, a microcomponent part may be presented to a common functional site (or to different functional sites that are operable to perform identical handling tasks) multiple times to achieve a desired handling task. For instance, suppose that multiple functional sites are available on a substrate that are each operable to rotate a microcomponent part 90 degrees about a rotational axis that is orthogonal to the substrate. Further suppose that it is desired to have a microcomponent part rotated 180 degrees so that it is properly oriented for assembly with another part. The microcomponent part may, therefore, be presented to a first functional site that rotates it 90 degrees, and it may then be presented to a second functional site (or re-presented to the first functional site) to be rotated an additional 90 degrees such that the desired 180 degree rotation is achieved. Thereafter, the part may be retrieved from the functional site in which it resides and assembled with another part.

Turning to FIG. 1, an exemplary substrate (e.g., wafer) 150 of a preferred embodiment is shown that comprises a plurality of functional sites 10–19. Each of functional sites 10–19 comprise a micro-device operable to perform a particular handling task on a microcomponent part presented thereto to aid in an assembly process for assembling microcomponent parts into a micro-device, for example. For instance, functional sites 10–19 may include one or more sites comprising micro-devices for rotating a microcomponent part presented thereto in a particular manner. For example, functional sites 10–19 may include one or more sites comprising micro-devices operable to rotate a microcomponent part presented thereto about a particular axis of rotation.

In the example of FIG. 1, substrate 150 includes functional sites 10 and 15 that each comprise a micro-device operable to rotate a microcomponent part presented thereto in $\pm\psi$ (which is described further hereafter). Substrate 150 also includes functional sites 11 and 16 that each comprise a micro-device operable to rotate a microcomponent part presented thereto in $\pm\phi$ (which is described further hereafter). Additionally, substrate 150 includes function site 12 that comprises a micro-device operable to rotate a microcomponent part in $\pm\theta$ (which is described further hereafter). Functional sites of substrate 150 need not be bi-directional. For instance, site 13 of substrate 150 comprises a micro-device operable to provide $+\theta$ rotation to a microcomponent part presented thereto, and site 14 comprises a micro-device operable to provide $-\theta$ rotation to a microcomponent part presented thereto. Further functional sites 17, 18, and 19 are included on exemplary substrate 150 to provide handling functionality A, B, and C, respectively. Such further handling functionality provided by the micro-devices of functional sites 17, 18, and 19 may comprise any desired rotational handling or translational handling of a microcomponent part.

As further shown in FIG. 1, substrate 150 may include assembly site 20, which may be a site at which microcomponent parts may be assembled together. For instance, in a preferred embodiment, an external robot (not shown in FIG. 1) that is operable to provide linear translational movement may be used to present microcomponent parts to the appropriate functional sites 10–19, which in turn rotate the parts to appropriate orientations for assembly together. The external robot may then retrieve the parts from the functional sites and assemble them at assembly site 20 to form an assembled micro-device. For example, once a microcomponent part is appropriately oriented by one or more of functional sites 10–19, the external robot having translational movement may retrieve the part from the functional site in which it resides and couple the part with another part at the assembly site 20. Any number of microcomponent parts may be handled in this manner to create a desired assembly of microcomponents. Additionally, an assembly of two or more microcomponents may be retrieved from assembly site 20 and presented to one or more of functional sites 10–19 to perform handling of such microcomponent assembly to, for example, orient the assembly as desired for assembly with further microcomponent parts. Thus, functional sites 10–19 are not limited to handling individual microcomponent parts, but may be utilized for performing handling tasks on an assembly comprising two or more microcomponent parts. Of course, in certain implementations, assembly site 20 may not be included on substrate 150, and instead microcomponent parts may be assembled at a location off of substrate 150.

As further shown in FIG. 1, control system 151 may be communicatively coupled to substrate 150 to control the operation of functional sites 10–19. That is, control system 151 may be operable to communicate control signals to functional sites 10–19 to control the handling of a microcomponent presented thereto in a desired manner. For instance, a functional site may be operable to rotate a microcomponent part presented thereto 90 degrees, and upon a part being presented to such functional site control system 151 may communicate control signal(s) to such functional site to activate it to rotate the part 90 degrees. As another example, a functional site may be operable to rotate a microcomponent part presented thereto any desired amount between 0 and 90 degrees, and upon a part being presented to such functional site, control system 151 may communicate control signal(s) to such functional site to activate it to rotate the part a desired amount (e.g., the control signal(s) may control the amount of rotation to be performed by the micro-device at such functional site).

It should be understood that substrate 150 is intended solely as an example for illustrating aspects of a preferred embodiment of the present invention. Various other implementations of such a substrate comprising a plurality of functional sites for handling microcomponent parts for performing handling operations, such as rotational operations, are intended to be within the scope of the present invention. For instance, while substrate 150 includes 10 functional sites (i.e., 10–19), substrate 150 is not limited to having 10 functional sites but may in other implementations have two or more functional sites included thereon. For instance, in an alternative implementation, substrate 150 may include two functional sites that each include a micro-device operable to rotate a microcomponent part presented thereto in a particular manner. Additionally, the two functional sites may be identical in functionality in certain implementations, wherein a common rotational operation may be performed on different microcomponent parts in parallel, for example. In other implementations, the two functional sites may provide different functionality. Also, while exemplary handling functions, such as particular rotational functions, are described hereafter as being provided by each functional site 10–19, substrate 150 is not limited to implementing functional sites providing the exemplary handling tasks described herein. Further, the functional sites are not limited to comprising the exemplary micro-devices described herein for performing handling tasks, but may instead include any suitable micro-device now known or later discovered for performing a desired handling task.

Figure 2A:
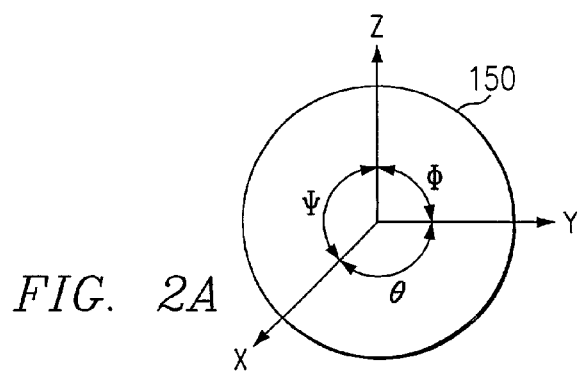
FIG. 2A shows three-dimensional axes X, Y, and Z overlaying the substrate of FIG. 1 to illustrate the various types of rotation that may be performed on a microcomponent part.

In a preferred embodiment, substrate 150 includes a plurality of functional sites (such as sites 10–19) that are operable to perform rotational handling tasks for a microcomponent part presented thereto. Various types of rotation may be desired in handling a microcomponent part for performing an assembly operation. For example, FIG. 2A shows substrate 150 with three-dimensional axes X, Y, and Z to illustrate the various types of rotation that may be performed on a microcomponent part. As shown, axes X and Y are orthogonal axes that form (or are parallel to) the plane of substrate 150, and axis Z is orthogonal to such plane. One type of rotation, shown as $\theta$ in FIG. 2A, that may be performed is rotation about the Z axis. That is, a microcomponent part may be rotated a certain amount between the X and Y axes. Another type of rotation, shown as $\psi$ in FIG. 2A, that may be performed is rotation about the Y axis. That is, a microcomponent part may be rotated a certain amount between the X and Z axes. Still another type of rotation, which is shown as $\phi$ in FIG. 2A, is rotation about the X axis. That is, a microcomponent part may be rotated a certain amount between the Y and Z axes. Rotating a microcomponent in $\psi$ or in $\phi$ may each be referred to herein as "flipping" the microcomponent. Any one or more of such types of rotation may be provided by the functional sites implemented on substrate 150. Thus, any type of rotation that may be needed for orienting a microcomponent part for assembly with another part may be performed by one or more of the micro-devices implemented at the functional sites (such as sites 10–19) of substrate 150.

FIG. 2B shows various rotational operations that micro-devices may be included on substrate 150 for performing on a microcomponent part presented thereto. As shown, a microcomponent part may be presented to a micro-device oriented in any manner. For instance, a particular portion of the microcomponent part that is to engage a micro-device may be oriented parallel to the X-Y plane, parallel to the X-Z plane, or parallel to the Y-Z plane. Additionally, as shown in the table of FIG. 2B, it may be desirable to rotate such a microcomponent part in $\pm\theta$, $\pm\phi$, and/or $\pm\psi$. Accordingly, it may be desirable to include micro-devices on the functional sites of substrate 150 that are operable to receive a microcomponent part in a particular orientation (e.g., capable of engaging a microcomponent part that is oriented parallel to the X-Y plane, parallel to the X-Z plane, or parallel to the Y-Z plane), and operable to perform a particular type of rotation $\pm\theta$, $\pm\phi$, and/or $\pm\psi$ on the received microcomponent part. Exemplary micro-devices that may be implemented for performing any of such desired types of rotation are described further below.

Turning to FIGS. 3A and 3B, an example of an assembly operation for assembling two microcomponent parts 301 and 302 is shown. In this example, microcomponent part 302 is arranged on assembly site 20 of substrate 150. As shown, microcomponent part 302 includes apertures 302A. Microcomponent part 301 is further shown that comprises coupling mechanism 301A. To assemble microcomponent part 301 to part 302 in this example, coupling mechanism 301A may penetrate apertures 302A to achieve a coupling of parts 301 and 302, as shown in FIG. 3B. Examples of coupling mechanism 301A and apertures 302A that may be implemented are further disclosed in U.S. patent application Ser. No. 09/570,170 entitled "SYSTEM AND METHOD FOR COUPLING MICROCOMPONENTS" and U.S. patent application Ser. No. 09/643,011 entitled "SYSTEM AND METHOD FOR COUPLING MICROCOMPONENTS UTILIZING A PRESSURE FITTING RECEPTACLE," the disclosures of which have been incorporated herein by reference.

As shown in FIG. 3A, microcomponent part 301 is not initially oriented properly for being assembled with microcomponent part 302. That is, microcomponent part 301 is not oriented such that coupling mechanism 301 may engage apertures 302A. Rather, microcomponent part 301 needs to be rotated in $+\theta$ and in $+\psi$ in order for coupling mechanism 301 to be oriented for engaging apertures 302A. Thus, in accordance with a preferred embodiment of the present invention, microcomponent part 301 may be presented to one or more functional sites of substrate 150 to be properly oriented for assembly with microcomponent part 302. For example, an external robot having translational movement may present microcomponent part 301 to site 12 of substrate 150, whereat a micro-device rotates microcomponent part 301 an appropriate amount in +θ. The external robot may then retrieve microcomponent part 301 and present it to site 10 of substrate 150, whereat a micro-device rotates microcomponent part 301 an appropriate amount in +ψ such that coupling mechanism 301A is properly oriented for engaging apertures 302A. Thereafter, the external robot may retrieve microcomponent part 301, transport it to assembly site 20, and couple coupling mechanism 301A with apertures 302A to assemble the microcomponent parts, resulting in assembly 350 of FIG. 3B.

As described above, one type of rotational handling task that may be desired for orienting a microcomponent part for assembly with another part is rotating the microcomponent part about the Y axis in ±ψ (or "flipping" the microcomponent part). Accordingly, exemplary substrate 150 of FIG. 1 includes functional site 10 that comprises a micro-device operable to perform such ±φ rotation on a microcomponent part presented thereto. Examples of such a micro-device operable to perform ±ψ rotation on a microcomponent part are described further hereafter in conjunction with FIGS. 4 and 5.

Figure 4A:
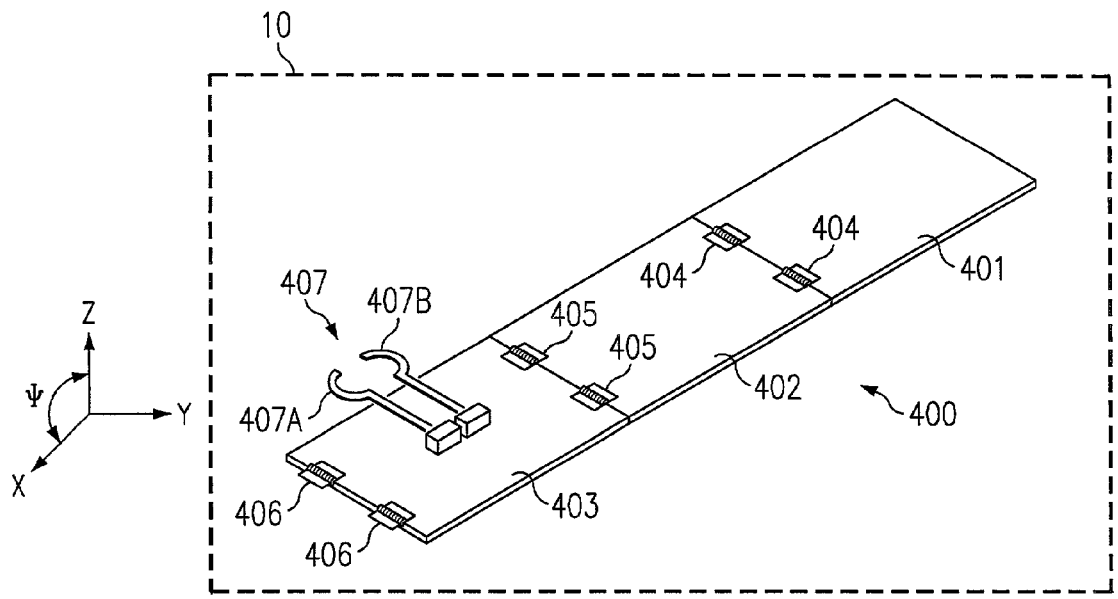
FIGS. 4A and 4B show an exemplary micro-device that is operable to provide $\pm\psi$ rotation (or "flipping") of a microcomponent part.
Figure 4B:
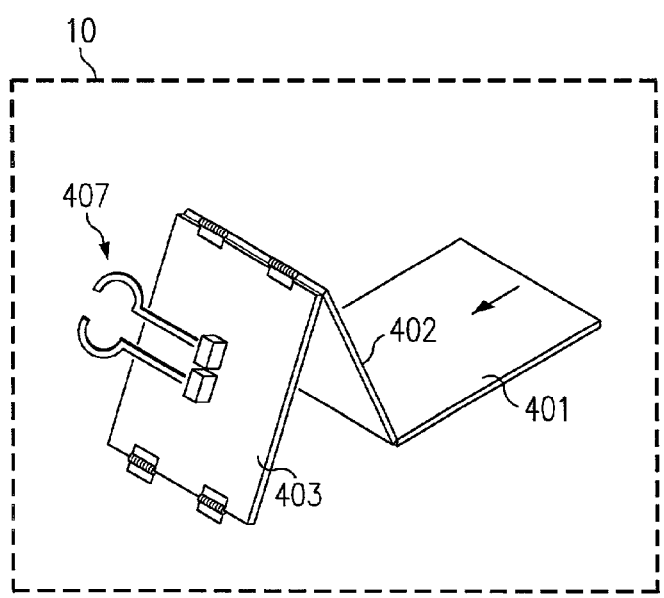

Turning to FIGS. 4A and 4B, an exemplary micro-device 400 that is operable to provide ±ψ rotation (or "flipping") of a microcomponent part is shown. Accordingly, micro-device 400 may be implemented at functional site 10 of wafer 150, for example, to provide ±ψ rotation. Micro-device 400 comprises at least one microactuator 401, which may be any suitable microactuator now known or later discovered, including well known thermal actuators (or "heatuators") and linear microactuators, such as scratch drive actuators (SDAs). Microactuator 401 is coupled to plate 402, which may be referred to as a hypotenuse plate 402 (for reasons described hereafter), via hinge(s) 404. Hypotenuse plate 402 is similarly coupled to plate 403 via hinge(s) 405, and plate 403 is coupled to the substrate via hinges 406. Plate 403 comprises a micro-gripper 407 that is operable to grasp a microcomponent part presented thereto.

As shown in FIG. 4A, such micro-gripper 407 may be a micro-tweezer device comprising two arms 407A and 407B that are controllably contractable or separable for grasping a microcomponent part. Such a micro-tweezer device 407 that may be implemented is known in the art, an example of which is described in "Hexsil Tweezers for Teleoperated Microassembly" by C. G. Keller and R. T. Howe, *IEEE Micro Electro Mechanical Systems Workshop,* 1997, pp. 72–77, the disclosure of which is hereby incorporated herein by reference. Micro-gripper 407 may comprise any suitable micro-device for grasping a microcomponent part, including without limitation the devices disclosed in co-pending U.S. patent application Ser. No. 09/570,170 entitled "SYSTEM AND METHOD FOR COUPLING MICROCOMPONENTS", co-pending U.S. patent application Ser. No. 09/643,011 entitled "SYSTEM AND METHOD FOR COUPLING MICROCOMPONENTS UTILIZING A PRESSURE FITTING RECEPTACLE," and co-pending U.S. patent application Ser. No. 09/569,329 entitled "GRIPPER AND COMPLEMENTARY HANDLE FOR USE WITH MICROCOMPONENTS," the disclosures of which have been incorporated herein by reference. In one implementation, a silicon-based spring may be coupled to micro-gripper device 407 to enable power to be supplied to such gripper device regardless of the orientation of plate 403. That is, the spring may expand as plate 403 rotates upward, and it may contract as plate 403 rotates downward (in the manner described below). An example of such a silicon-based spring that may be implemented to power micro-gripper 407 is described further by P. Kladitis, et al. in "Prototype Microrobots for Micro Positioning in a Manufacturing Process and Micro Unmanned Vehicles" *Proc. of IEEE 12$^{th}$ Int. Conf. on MEMS*, Orlando, U.S.A., 1999, the disclosure of which is hereby incorporated herein by reference.

Microactuator 401 preferably includes at least one SDA, such as the SDA described more fully by Ryan J. Lunderman and Victor M. Bright in "Optimized Scratch Drive Actuator for Tethered Nanometer Positioning of Chip-Sized Components" *Proc. of 2000 Solid-State Sensor and Actuator Workshop*, Hilton Head Island, S.C., U.S.A., pp. 214–217 (Jun. 4–8, 2000), the disclosure of which is hereby incorporated herein by reference. In this example, microactuator 401 is oriented such that it provides translational movement along the X axis. As shown in FIG. 4B, microactuator 401 may be activated to advance in the +X direction, thereby effectively pushing plate 403 upward, which results in rotation of a microcomponent part being held by micro-gripper 407 to be rotated in +ψ. More specifically, as microactuator 401 advances in the +X direction, hypotenuse plate 402 pops upward in the +Z direction, thereby rotating plate 403 in +ψ. Preferably, microactuator 401 is operable to translate in the +X direction a sufficient distance to cause plate 403 to stand upright such that it is perpendicular to the X-Y plane (i.e., perpendicular to the substrate). When plate 403 is caused to stand upright in this manner, a right triangle is formed between the substrate (X-Y plane), plate 403, and plate 402, wherein plate 403 is at a 90 degree angle to the substrate and plate 402 forms the hypotenuse. Thus, plate 402 may be referred to as hypotenuse plate 402.

As described above, micro-device 400 may be used to receive a microcomponent part and rotate the microcomponent part in +ψ. Further, micro-device 400 may be utilized to receive a microcomponent part and rotate the part in −ψ. For instance, microactuator 401 may be activated to advance in the +X direction, thereby effectively pushing plate 403 upward (e.g. to stand plate 403 upright). A microcomponent part may then be presented to micro-gripper 407, and once micro-gripper 407 receives the microcomponent part, microactuator 401 may translate in the −X direction, thereby effectively lowering plate 403 downward (toward the orientation of plate 403 in FIG. 4A). Such operation results in rotation of the microcomponent part being held by micro-gripper 407 in −ψ.

The above-described technique for raising and lowering plate 403 is similar to existing techniques implemented for raising and lowering micro-mirrors for use in optical switching devices, for example. See e.g., J. Robert Reid, Victor M. Bright, and J. H. Comtois, "Automated Assembly of Flip-up Micromirrors," *TRANSDUCERS '97, 1997 International Conference on Solid-State Sensors and Actuators*, pgs. 347–350 (Jun. 16–19, 1997), the disclosure of which is hereby incorporated herein by reference. However, such existing techniques do not allow for handling of a microcomponent part to perform rotation (or flipping) of such microcomponent part to, for example, orient the part for assembly with another part. As described above, plate 403 of exemplary micro-device 400 includes a micro-gripper that enables it to grasp a microcomponent part to be flipped up along with plate 403. Thus, exemplary micro-device 400 is operable to handle a microcomponent part to rotate (or "flip") such part in ±ψ.

While microactuator 401 is oriented to provide translational movement along the X axis to allow for ±ψ rotation in the example of FIGS. 4A–4B, in other implementations microactuator 401 may be oriented in any other desired manner. For instance, microactuator 401 may be oriented to provide translation along the Y axis to allow for ±φ rotation (such as shown in the exemplary micro-device of FIGS. 8A–8B). Thus, as described above, micro-device 400 may be implemented at a functional site to perform ±ψ rotation or ±φ rotation (either of which may be referred to as "flipping") for a microcomponent part presented thereto.

Exemplary micro-device 400 of FIGS. 4A–4B includes micro-gripper 407 that is oriented to allow for grasping of a microcomponent part by applying a force against the part in a direction that is parallel to plate 403. For instance, micro-gripper 407 applies a force in a direction parallel to the X–Y plane when grasping a microcomponent part while plate 403 is parallel to such X–Y plane (as shown in FIG. 4A), and when plate 403 is oriented perpendicular to the X–Y plane, micro-gripper 407 is operable to grasp a microcomponent part by applying a force in the direction perpendicular to the X–Y plane against such part. In some instances, it may be desirable to apply a grasping force in a direction perpendicular to plate 403. For instance, a microcomponent part may be oriented such that it is desirable to grasp the part by applying a force against the part in a direction that is perpendicular to plate 403.

Figure 5A:
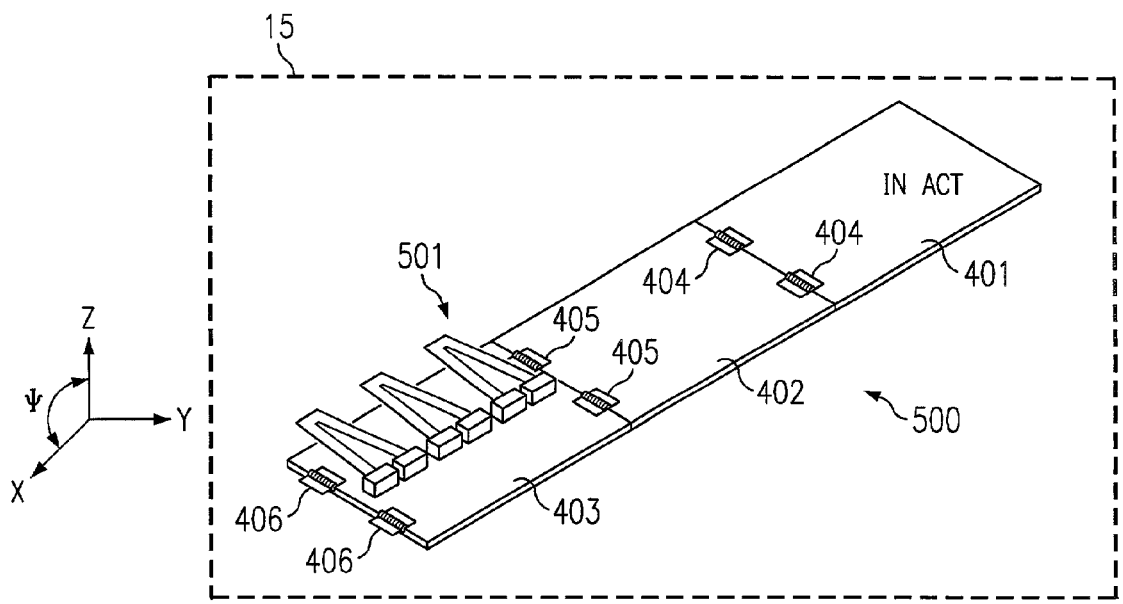
FIGS. 5A and 5B show another exemplary micro-device that is operable to provide $\pm\psi$ rotation (or "flipping") of a microcomponent part.
Figure 5B:
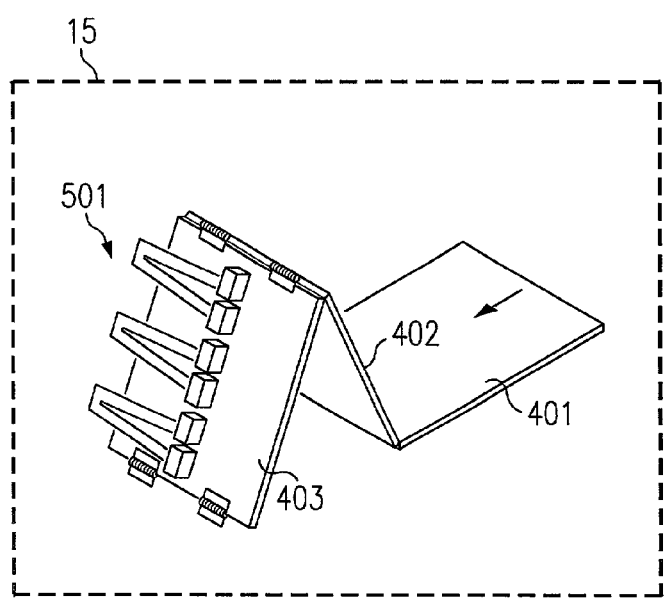

FIGS. 5A–5B show an exemplary micro-device 500 that is operable to provide ±ψ rotation (or "flipping") of a microcomponent part. Micro-device 500 is similar to micro-device 400 described above, but rather than micro-gripper 407, micro-device 500 includes micro-gripper 501 that is operable to grasp a microcomponent part by applying a force against the part in a direction perpendicular to plate 403. Thus, micro-device 500 may, for example, be implemented at functional site 15 of wafer 150 (of FIG. 1) to provide ±ψ rotation. As with micro-device 400, micro-device 500 comprises at least one microactuator 401, that is coupled to plate 402, which may be referred to as a hypotenuse plate 402, via hinge(s) 404. Hypotenuse plate 402 is similarly coupled to plate 403 via hinge(s) 405, and plate 403 is coupled to the substrate via hinges 406.

As with micro-device 400 described above, microactuator 401 is oriented such that it provides translational movement along the X axis. Thus, as shown in FIG. 5B, microactuator 401 may be activated to advance in the +X direction, thereby effectively pushing plate 403 upward, which results in rotation of a microcomponent part being held by micro-gripper 501 to be rotated in +ψ. Further, as described with micro-device 400, micro-device 500 may be utilized to receive a microcomponent part and rotate the part in −ψ. While microactuator 401 is oriented to provide translational movement along the X axis to allow for ±ψ rotation in this example, in other implementations microactuator 401 may be oriented in any other desired manner. For instance, microactuator 401 may be oriented to provide translation along the Y axis to allow for ±φ rotation (such as shown in the exemplary micro-device of FIGS. 8A–8B). Thus, as described above, micro-device 500 may be implemented at a functional site to perform ±ψ rotation or ±φ rotation (either of which may be referred to as "flipping") for a microcomponent part presented thereto.

Figure 6A:
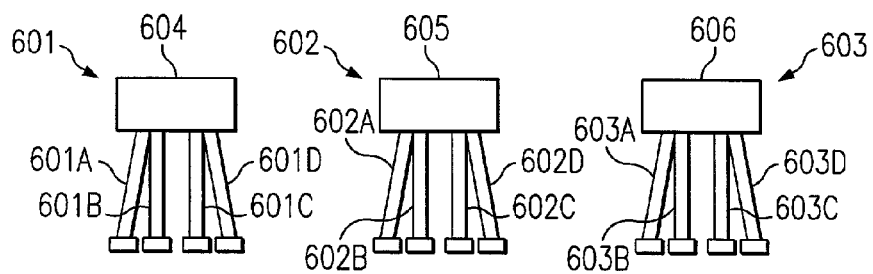
FIGS. 6A and 6B show an exemplary micro-gripper operable to grasp a microcomponent part, which is implemented in the exemplary micro-device of FIGS. 5A–5B.
Figure 6B:
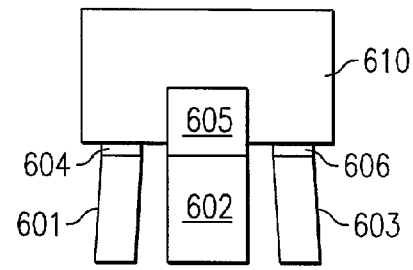

In exemplary micro-device 500, plate 403 comprises micro-gripper 501 that is operable to grasp a microcomponent part presented thereto by applying a force against the part in a direction perpendicular to plate 403. Turning to FIGS. 6A–6B, an exemplary micro-gripper 501 that may be implemented is shown. In the example shown in FIGS. 6A–6B, micro-gripper 501 comprises three gripping members 601, 602, and 603 that include engaging members 604, 605, and 606, respectively. Engaging members 604–606 may be implemented to engage a microcomponent part in order to grasp it. Such engaging members 604–606 may include features that are complementary to features of a microcomponent part to aid in grasping of such part, for example. Additionally, engaging members 604–606 may include dimples on their surfaces to reduce static friction (or "stiction") to aid in allowing micro-gripper 501 to release a grasped microcomponent part, for example.

Gripping members 601–603 may each include arms. More specifically, member 601 includes arms 601A–D, member 602 includes arms 602A–D, and member 603 includes arms 603A–D. Each of such arms may be of polysilicon material, for example. As shown, each of the arms may be anchored to plate 403 on one end and may be coupled to one of engaging members 604–606 on the other end. In operation, gripping members 601 and 603 may be operable to move their respective engaging members 604 and 606 toward plate 403, and gripping member 602 may be operable to move its engaging member 605 away from plate 403, thereby creating an opening (or separation) between the gripping members for receiving a microcomponent part. Once a part is received, the gripping members may operate to apply a force against such part in a direction that is perpendicular to plate 403 in order to grasp a microcomponent part in the manner shown in FIG. 6B. More specifically, FIG. 6B shows an example of engaging members 604–606 grasping a microcomponent part 610.

To illustrate operation of middle gripping member 602, an electrical voltage is applied across the two outer arms 602A and 602D generating current flow. This current flow causes expansion in outer arms 602A and 602D. The inner arms 602B and 602C are arranged higher than the outer arms 602A and 602D and work to hold back the expansion of outer arms 602A and 602D. The result effect is that the arms cause engaging member 605 to pop upward (away from plate 403) when operated in this manner.

As for gripping members 601 and 603, an electrical voltage is applied across the two inner arms, thus generating current flow. This current flow causes expansion in their respective inner arms, thus causing their respective engaging members 604 and 606 to move downward toward plate 403. For instance, considering gripping member 601, an electrical voltage may be applied to inner arms 601B and 601C to generate current flow. This current flow causes inner arms 601B and 601C to expand, thereby forcing engaging member 604 downward (toward plate 403) when operated in this manner.

In view of the above, micro-devices may be implemented at one or more functional sites on substrate 150 that are operable to rotate a microcomponent part presented thereto about the Y axis in ±ψ and/or about the X axis in ±φ. Another type of rotational handling task that may be desired for orienting a microcomponent part for assembly with another part is rotating the microcomponent part about the Z axis in ±θ. Accordingly, exemplary substrate 150 of FIG. 1 includes functional site 12 that comprises a micro-device operable to perform such ±θ rotation on a microcomponent part presented thereto.

Various micro-devices have been proposed in the existing art for performing θ rotation of a microcomponent part, any of which may be implemented at one or more functional sites of substrate 150 in certain embodiments of the present invention. As examples, U.S. Pat. No. 6,137,206 issued to Edward Hill and U.S. Pat. No. 5,914,801 issued to Vijaya-kumar Dhuler et al. each disclose exemplary micro-devices for performing θ rotation of a microcomponent part that may be implemented in certain embodiments of the present invention. Also, Karl-Friedrich Böhringer et al. propose an array of microactuators that may be used to perform θ rotation of a microcomponent part in an article titled "Single-Crystal Silicon Actuator Arrays for Micro Manipulation Tasks" published in *IEEE* pgs. 7–12, 0-7803-2985-6/96 (1996). See also, Karl-Friedrich Böhringer et al. "Vector Fields for Task-Level Distributed Manipulation: Experiments with Organic Micro Actuator Arrays," *IEEE* pgs. 1779–1786, 0-7803-3612-7-4/97 (1997). As another example, John W. Suh et al. disclose a microactuator array for performing θ rotation of a microcomponent part presented to such array in "Organic thermal and electrostatic ciliary microactuator array for object manipulation," *Sensors and Actuators* A 58 (1997) pgs. 51–60. As a further example, Jonathan Luntz et al. propose a microactuator array for performing θ rotation of a microcomponent part presented to such array in "Closed-Loop Operation of Actuator Arrays," *IEEE* pgs. 3666–3672, 0-7803-5886-April 2000 (2000). As still a further example, Peter Will discloses that arrays of microactuators may be utilized to perform handling of microcomponent parts presented thereto in "MEMS and Robotics: Promises and Problems," *IEEE* pgs. 938–946, 0-7803-5886-April 2000 (2000). As yet a further example, Wenheng Liu et al. propose using a dense array of individual manipulator mechanisms for performing handling tasks such as θ rotation of a microcomponent part presented to such array in "Parts Manipulation on an Intelligent Motion Surface," *IEEE* pgs. 399–404, 0-8186-717-April 1995 (1995).

Any one or more of such micro-devices proposed in the existing art for handling microcomponent parts may be implemented at one or more functional sites included on substrate 150. However, certain of the proposed micro-devices for handling microcomponent parts to perform θ rotation thereof may be unsatisfactory for some purposes. For example, traditional microactuator array implementations for rotating a microcomponent part placed on such microactuator array, such as the array implementation disclosed by Karl Friedrich Böhringer et al. in "Single-Crystal Silicon Actuator Arrays for Micro Manipulation Tasks," *IEEE* pgs. 7–12, 0-7803-2985-June 1996 (1996), may be unsatisfactory for certain purposes. For instance, such traditional microactuator array implementations for rotating a microcomponent part generally provide relatively little control over such rotation. For example, it is generally difficult to control the axis of rotation about which a microcomponent part rotates on the microactuator array. Often, a microcomponent part may be translated a certain distance as it is rotated. That is, the axis of rotation is often not controllably positioned at the center of the microcomponent part. For certain applications, it may be desirable to have more control over the rotation than is provided by traditional microactuator array implementations. For instance, it may be desirable to control the axis of rotation about which a microcomponent part is to rotate.

Accordingly, to provide greater control over the rotation performed by a micro-device, in certain embodiments of the present invention, a micro-rotational-device that includes a linear microactuator (e.g., scratch drive actuator), such as the rotational device disclosed in U.S. Pat. No. 6,137,206 issued to Edward Hill, may be implemented at one or more functional sites of substrate 150. Preferably, such micro-rotational-device is operable to provide bi-directional rotation of a microcomponent part presented thereto. Such a micro-rotational-device that utilizes a linear microactuator for generating rotation may provide great precision in the amount of rotation imparted to a microcomponent part presented to the micro-rotational-device, and it may further provide a known axis of rotation about which a part presented to the micro-rotational-device rotates.

Figure 7A:
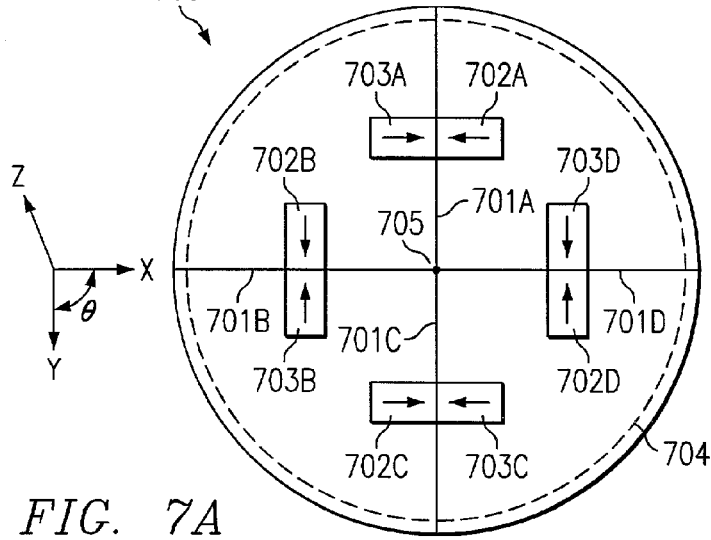
FIG. 7A shows an exemplary micro-device that is operable to provide $\pm\theta$ rotation of a microcomponent part.

Further examples of micro-devices operable to perform ±θ rotation on a microcomponent part, which may be implemented at functional sites of substrate 150, are described hereafter in conjunction with FIGS. 7–9. Turning to FIG. 7A, an exemplary micro-device 700 that is operable to provide ±θ rotation of a microcomponent part is shown. Accordingly, micro-device 700 may be implemented at functional site 12 of wafer 150 to provide ±θ rotation, for example. Micro-device 700 comprises a support frame that includes spokes 701A–D that are rotatable about electrically isolated rotational axis 705. Linear microactuators 702A–D may be included that, when activated, provide a force against spokes 701A–D, respectively, to generate counter-clockwise rotation. Similarly, linear microactuators 703A–D may be included that, when activated, provide a force against spokes 701A–D, respectively to generate clockwise rotation.

Thus, linear microactuators 702A–D and 703A–D may be independently controllable to generate the direction of rotation desired. More specifically, linear microactuators 702A–D may be electrically isolated from linear microactuators 703A–D to enable each set of linear microactuators to be independently controlled (e.g., activated and de-activated). For example, in one implementation spokes 701A–D may include an electrical insulator to electrically isolate linear microactuators 702A–D from linear microactuators 703A–D. Exemplary techniques for implementing linear microactuators that are electrically isolated from each other are further disclosed in concurrently filed U.S. patent application Ser. No. 10/033,011 entitled "SYSTEM AND METHOD FOR POSITIONAL MOVEMENT OF MICRO-COMPONENTS," the disclosure of which has been incorporated herein by reference. Preferably, linear microactuators 702A–D and 703A–D are SDAs. A stage 704 may be arranged above spokes 701A–D along the Z axis and may be coupled to such spokes 701A–D such that rotation of spokes 701A–D generated by microactuators 702A–D or 703A–D generates rotation of stage 704 about rotational axis 705.

In operation, a microcomponent part desired to be rotated in ±θ is placed on stage 704. Because rotational axis 705 is known for micro-rotational-device 700, the microcomponent part may be placed on stage 704 in a manner to obtain a desired rotation. For instance, if it is desired to rotate the microcomponent part without any translation of the part in the X or Y directions, the part may be precisely placed on stage 704 such that it is centered on rotational axis 705. Once the microcomponent part is placed on stage 704, linear microactuators 702A–D or 703A–D may be activated to generate rotation of stage 704, thereby rotating the microcomponent part placed on such stage 704.

Figure 7B:
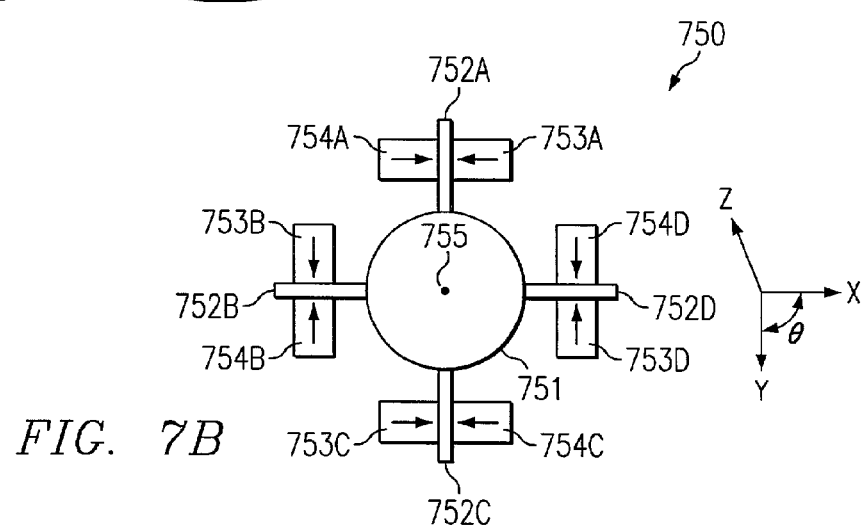
FIG. 7B shows another exemplary micro-device that is operable to provide $\pm\theta$ rotation of a microcomponent part.

Turning to FIG. 7B, an exemplary micro-device 750 that is operable to provide ±θ rotation of a microcomponent part is shown. Accordingly, micro-device 750 may be implemented at functional site 13 of wafer 150 to provide ±θ rotation, for example. Micro-device 750 comprises rotational stage 751 that has members 752A–D extending therefrom. Linear microactuators 753A–D may be included that, when activated, provide a force against members 752A–D, respectively, to generate counter-clockwise rotation. Similarly, linear microactuators 754A–D may be included that, when activated, provide a force against members 752A–D, respectively, to generate clockwise rotation. Preferably, linear microactuators 753A–D and 754A–D are SDAs. Rotational stage 751 is implemented such that it is rotatable responsive to microactuators 753A–D and 754A–D about rotational axis 755.

In operation, a microcomponent part desired to be rotated in ±θ is placed on stage 751. Because rotational axis 755 is known for micro-rotational-device 750, the microcomponent part may be placed on stage 751 in a manner to obtain a desired rotation. For instance, if it is desired to rotate the microcomponent part without any translation of the part in the X or Y directions, the part may be precisely placed on stage 751 such that it is centered on rotational axis 755. Once the microcomponent part is placed on stage 751, linear microactuators 753A–D or 754A–D may be activated to generate rotation of stage 751, thereby rotating the microcomponent part placed on such stage 751 about axis 755.

Exemplary micro-devices 700 and 750 described above provide the capability of precisely rotating a microcomponent part placed on their respective rotational stages in ±θ. In certain applications, it may be desirable to have a microcomponent part held above the substrate (or a rotational stage) and rotated in ±θ, or it may be desirable to have a microcomponent part grasped in some manner to hold the part in place on a surface (such as the surface of a rotational stage) while rotated in ±θ. For instance, it may not be desirable to place certain microcomponent parts on a rotational stage to have the parts rotated in ±θ. For example, a microcomponent part may have a design such that it may not maintain the orientation in which it was presented to the stage. For instance, a microcomponent part may have a protruding member that causes it to tilt to one side when placed on a rotational stage, which may be undesirable for certain handling applications. FIGS. 8–9 provide an exemplary micro-device that is operable to hold a microcomponent part presented thereto above the substrate (and rotational stage), such that the part is not required to be placed on a surface, and provide ±θ rotation to the part. Alternatively, the exemplary micro-device of FIGS. 8–9 may be utilized to grasp a microcomponent part placed on a surface to hold the part in place while it is rotated in ±θ.

Figure 8A:
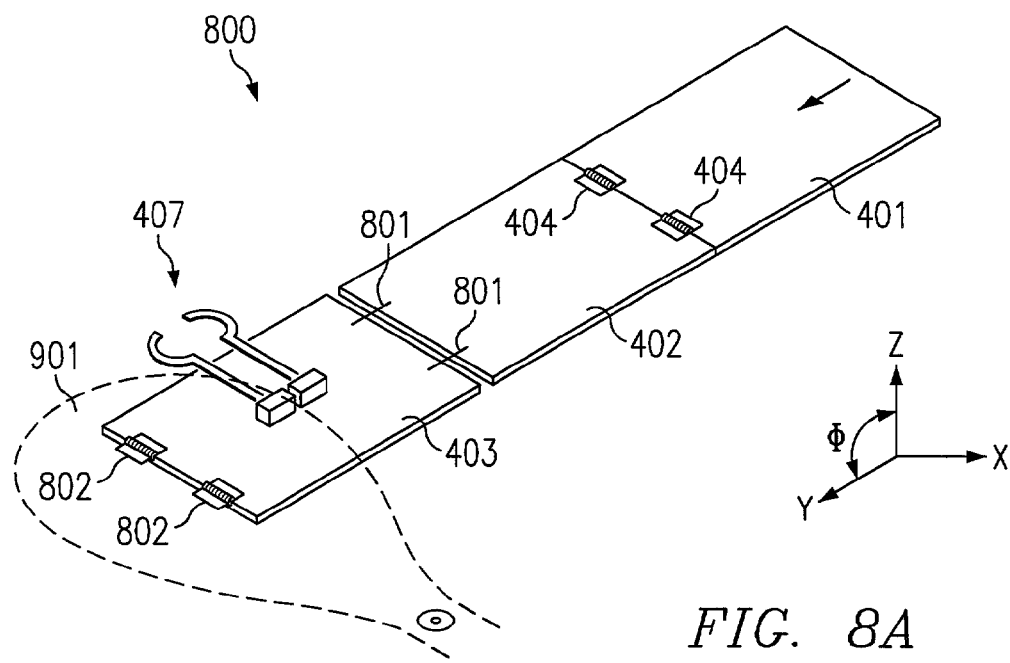
FIGS. 8A and 8B show an example of a fabricated microcomponent that is operable to perform a post-fabrication self-assembly operation to form a three-dimensional micro-device operable to hold a microcomponent part presented thereto above a surface.
Figure 9A:
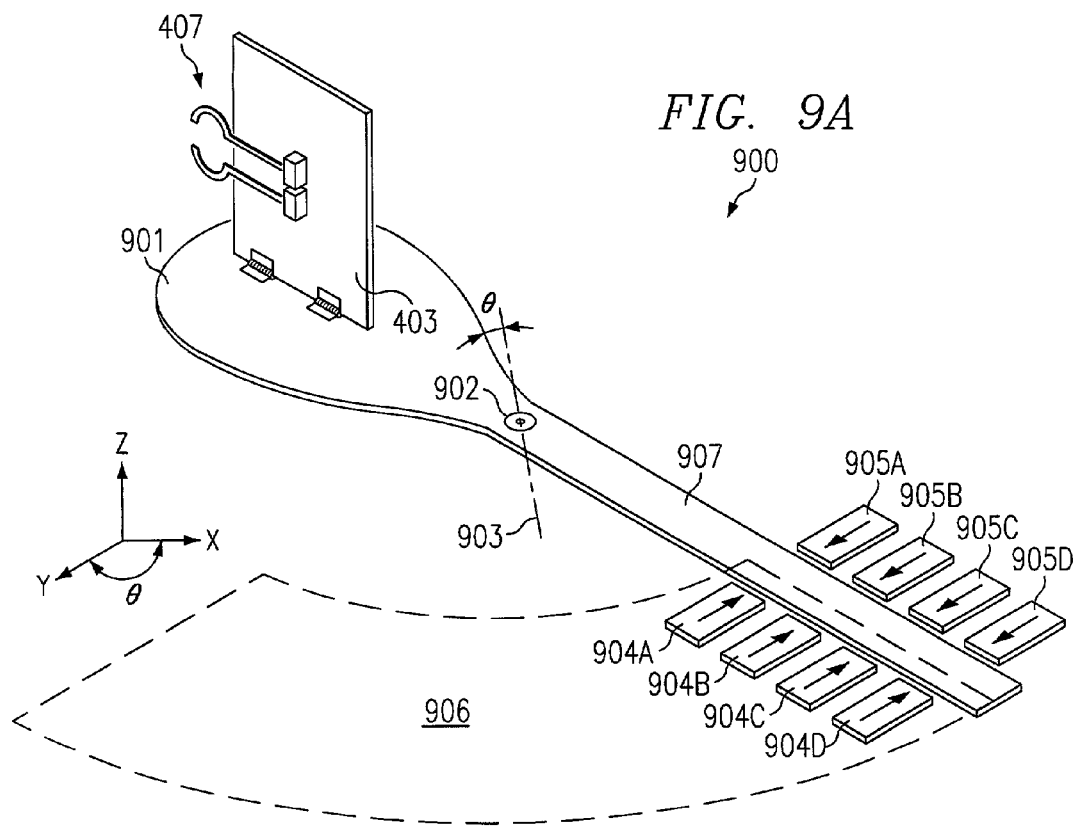
FIG. 9A shows an exemplary micro-device operable to provide $\pm\theta$ rotation of a microcomponent part held above a surface.
Figure 9B:
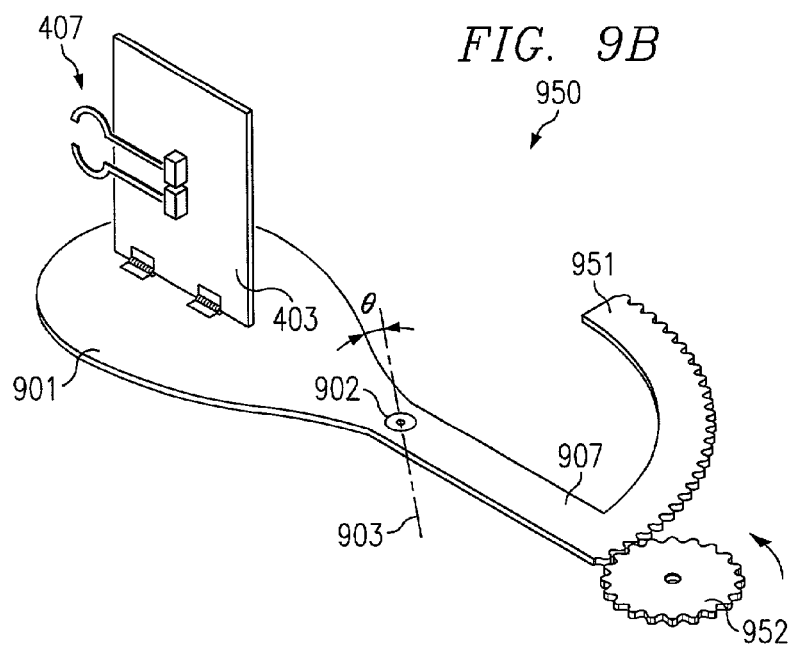
FIG. 9B shows another exemplary micro-device operable to provide $\pm\theta$ rotation of a microcomponent part held above a surface.

Turning to FIG. 8A, an example of a fabricated microcomponent 800 is shown, which is operable to form a mechanism used in micro-device 900 of FIGS. 9A and 9B described hereafter for providing ±θ rotation for a microcomponent part that is held above (or held in place on) a surface (e.g., rotational stage and substrate). Preferably, a fabrication process is utilized to create microcomponent 800 as shown in FIG. 8A, and microcomponent 800 may be operable to perform a post-fabrication self-assembly step to generate a three-dimensional micro-device 900 of FIG. 9A (or three-dimensional micro-device 950 of FIG. 9B) that is operable to hold a microcomponent part above (or hold in place on) a surface and provide ±θ rotation.

Microcomponent 800 is similar in operation to the micro-device 400 of FIG. 4 and micro-device 500 of FIG. 5 in that it is operable to provide +ψ rotation to plate 403. As with micro-devices 400 and 500 described above, micro-device 800 comprises at least one microactuator 401 that is coupled to plate 402, which may be referred to as a hypotenuse plate 402, via hinge(s) 404. However, in micro-device 800, hypotenuse plate 402 is temporarily coupled to plate 403 via "one-time" (or "one-shot") hinge(s) 801. Such one-time hinge(s) 801 enable hypotenuse plate 402 to apply a pushing force against plate 403 (responsive to translation by microactuator 401) to raise plate 403 in +ψ, but one-time hinge(s) 801 do not allow for hypotenuse plate 402 to apply a pulling force against plate 403 to lower plate 403 in −ψ. One-time hinge(s) 801 may, for example, comprise interlocking teeth between plates 402 and 403 such that the interlocking teeth enable plate 402 to engage plate 403 to apply force for raising plate 403 in +ψ and the interlocking teeth disengage when plate 402 is moved in the opposite direction.

Also, in this exemplary implementation, plate 403 is coupled to base 901 (which may be referred to as "paddle" or "rotational stage" 901) via locking hinge(s) (or "snap hinges") 802, which are known in the existing art. Such locking hinge(s) 802 are operational to enable plate 403 to be raised upward to a desired position and then locked in place to support plate 403 in the desired position. For instance, plate 403 may be raised to a position such that it is perpendicular to base 901, and locking hinge(s) 802 may lock plate 403 into place to support it in such perpendicular position.

Figure 8B:
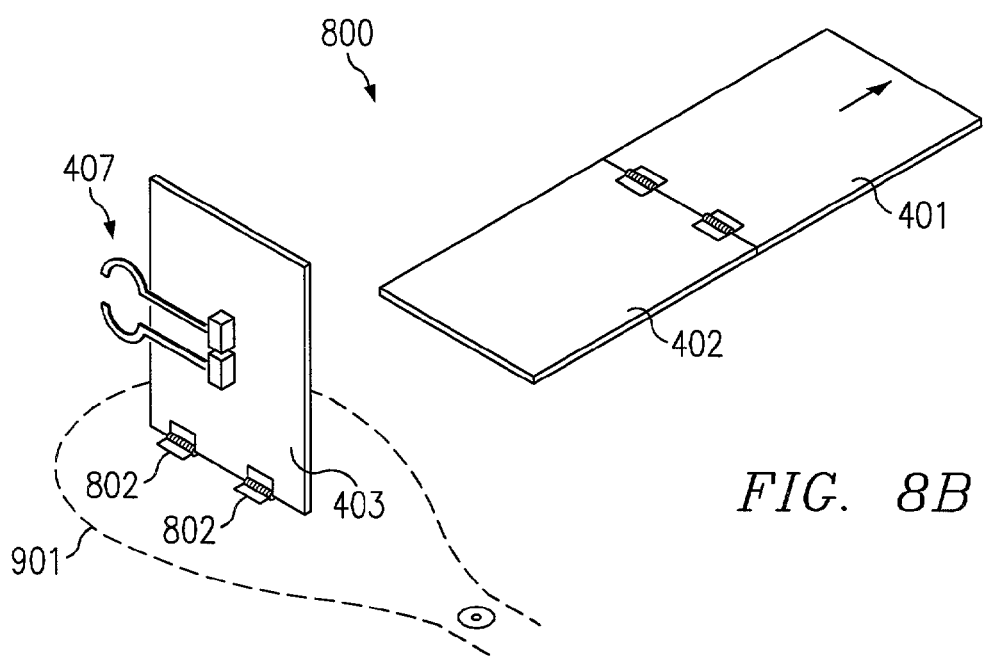

As with micro-device 400 described above, plate 403 comprises micro-gripper 407. However, in alternative implementations, plate 403 may comprise any micro-gripper device now known or later discovered, including without limitation micro-gripper 501 of FIG. 5. In this example, microactuator 401 is oriented such that it provides translational movement along the Y axis. Thus, microactuator 401 may be activated to advance in the +Y direction, thereby effectively pushing plate 403 upward in +φ. While microactuator 401 is oriented to provide translational movement along the Y axis to allow for +φ rotation of plate 403 in this example, in other implementations microactuator 401 may be oriented in any other desired manner. For instance, microactuator may be oriented to provide translation along the X axis to allow for +ψ rotation. Once plate 403 is raised to a locking position (e.g., perpendicular to base 901), locking hinge(s) 802 lock its position to support plate 403. As shown in FIG. 8B, once plate 403 is locked in place, microactuator 401 may be caused to translate in the opposite direction (−Y direction). Microactuator 401 pulls plate 402 in the −Y direction causing one-time hinge(s) 801 to release, thereby resulting in plate 403 oriented in its locked position on base 901 as shown in FIG. 8B.

Turning now to FIG. 9A, an exemplary micro-device 900 is shown that is operable to hold a microcomponent part presented thereto such that it is held above a surface (e.g., above base 901) and provide ±θ rotation to such part. More specifically, micro-device 900 is a three-dimensional device that includes base (or "paddle") 901 having plate 403 extending upward therefrom in the Z direction. Plate 403 includes a micro-gripper, such as micro-gripper 407. Base 901 is coupled to (or includes) extension member 907, which may be referred to herein as "handle" 907 (as in this implementation extension member 907 resembles a handle of paddle 901). One or more microactuators 904A–D may be included that are operable to apply a force against extension member 907 in a first direction, and one or more microactuators 905A–D may be included that are operable to apply a force against extension member 907 in an opposite direction. Preferably, microactuators 904A–D and 905A–D are linear microactuators, such as SDAs, that are capable of translating along track 906.

Micro-device 900 further comprises pivot point 902 about which base 901 may rotate responsive to a force applied by microactuators 904A–D or 905A–D against extension member 907. Rotational axis 903 forms the Z axis (or is parallel thereto) that intersects micro-device 900 at pivot point 902. Thus, microactuators 905A–D may be activated to cause base 901 to rotate about rotational axis 903 in +θ, and microactuators 904A–D may be activated to cause base 901 to rotate about rotational axis 903 in −θ.

In operation, a microcomponent part may be presented to micro-gripper 407, which grasps the part and holds it above the surface of base 901. Thereafter, microactuators 905A–D may be controllably activated to advance along track 906 and apply a force against extension member 907 to cause base 901 to rotate about rotational axis 903 in +θ. Because plate 403 is on base 901, plate 403 rotates with base 901. Accordingly, rotation of base 901 causes the microcomponent part being held by micro-gripper 407 to rotate about axis 903 in +θ. Alternatively, microactuators 904A–D may be controllably activated to advance along track 906 and apply a force against extension member 907 in the opposite direction to cause base 901 to rotate about rotational axis 903 in −θ, thereby resulting in rotation of the microcomponent part being held by micro-gripper 407 to rotate about axis 903 in −θ.

In view of the above, exemplary micro-device 900 may be implemented at a functional site of substrate 150 to provide ±θ rotation to a microcomponent part held above (or held in place on) a surface (e.g., held above the surface of base 901). An example of an alternative implementation of a micro-device that may be implemented to provide such functionality is shown in FIG. 9B. More specifically, micro-device 950 is shown that, as with micro-device 900 described above, is a three-dimensional device that includes base (or "paddle") 901 having plate 403 extending upward therefrom in the Z direction. Plate 403 includes a micro-gripper, such as micro-gripper 407. As with micro-device 900, base 901 is coupled to (or includes) extension member 907. In this implementation, extension member 907 includes (or has coupled thereto) toothed member 951. Micro-device 950 further comprises micro-gear 952 that comprises teeth interlocking with the teeth of toothed member 951 such that micro-gear 952 may be activated to rotate to cause translation of toothed member 951.

Micro-device 950 further comprises pivot point 902 about which base 901 may rotate responsive to a force applied by micro-gear 952 to toothed member 951. Preferably, micro-gear 952 is bi-directional such that it may be controllably activated to rotate in a first direction or controllably activated to rotate in an opposite direction. Thus, micro-gear 952 may be activated to rotate in a first direction to cause base 901 to rotate about rotational axis 903 in +θ, and micro-gear 952 may be activated to rotate in an opposite direction to cause base 901 to rotate about rotational axis 903 in −θ. Accordingly, as described above with micro-device 900, a microcomponent part being held by micro-gripper 407 may be rotated about axis 903 in ±θ.

In a preferred embodiment, one or more of various micro-devices, such as those described above in conjunction with FIGS. 4–9, may be implemented at distinct functional sites on substrate 150 to perform rotational handling tasks to microcomponent parts presented thereto. For instance, micro-devices may be implemented at functional sites to perform ±θ rotation, ±ψ rotation, and/or ±φ rotation to a microcomponent part presented thereto.

Figure 10:
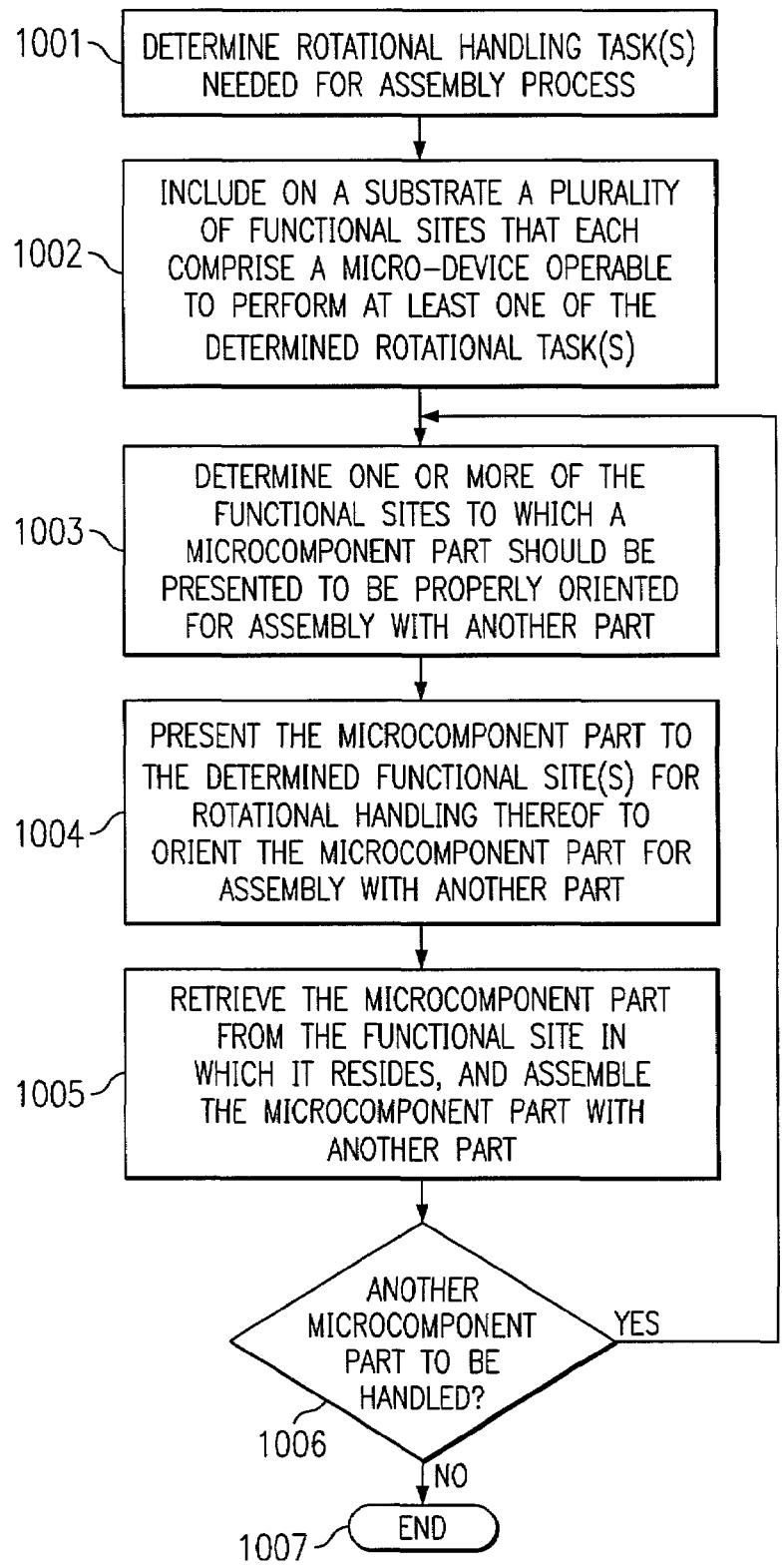
FIG. 10 shows an exemplary operational flow diagram for performing handling tasks for assembling at least one microcomponent part with another part according to a preferred embodiment of the present invention.

Turning to FIG. 10, an exemplary operational flow diagram of a preferred embodiment is shown for handling of microcomponent parts in performing assembly operations. In operational block 1501, the rotational handling task(s) needed for an assembly process may be determined. That is, the rotational handling task(s) needed for assembling microcomponent parts together may be determined. Thereafter, in block 1502, a substrate may be developed that includes a plurality of functional sites that each comprise a micro-device operable to perform at least one of the determined rotational handling task(s). For instance, it may be determined in block 1501 that an assembly process performs ±θ rotation of microcomponent part(s) and ±ψ rotation of microcomponent part(s). And, in block 1502, distinct functional sites may be included on a substrate with at least one site comprising a micro-device operable to perform ±θ rotation of a microcomponent part presented thereto and at least one site comprising a micro-device operable to perform ±ψ rotation of a microcomponent part presented thereto.

In block 1503, it is determined for a particular microcomponent part one or more of the functional sites on a substrate to which the microcomponent part is to be presented to be properly oriented for assembly with another part. For instance, it may be determined that the microcomponent part is to be rotated in +ψ to be properly oriented for assembly with another part, and therefore, a functional site of the substrate that comprises a micro-device operable to perform such +ψ rotation may be identified. As another example, it may be determined that the microcomponent part is to be rotated in −θ and in +ψ. In this case, a first functional site that comprises a micro-device operable to perform the −θ rotation may be identified, and a second functional site that comprises a micro-device operable to perform the +ψ rotation may be identified. In block 1504, the particular microcomponent part is presented to the determined functional site(s) for the appropriate rotational handling by the micro-device(s) of such site(s) for properly orienting the microcomponent part for assembly with another part. For instance, an external robot operable to grasp a microcomponent part and provide translational movement thereto may be used to present a part to the determined functional site(s), whereat the part may be rotated for proper orientation for assembly with another part.

Once the microcomponent part is properly oriented, it may be retrieved from the functional site in which it resides and assembled with another part, in block 1505. For instance, an external robot operable to grasp the microcomponent part and provide translational movement thereto may be utilized to retrieve the part and assemble the part with another part. In block 1506, it may be determined whether another microcomponent part is to be rotationally handled. If it is determined that another microcomponent part is to be handled in the assembly process, operation returns to block 1503 to perform the appropriate rotational tasks on such microcomponent part. Once it is determined in block 1506 that no further microcomponent parts are to be rotationally handled in the assembly process, the process may end in block 1507.

It should be recognized that the above process may enable at least a semi-parallel microcomponent handling process. For instance, a microcomponent part may be presented to a first functional site for rotational handling, and while it is being handled, a second microcomponent part may be presented to a second functional site for rotational handling. Once microcomponent parts are presented to the appropriate functional sites, their respective rotational handling tasks may be performed in parallel by the micro-devices at such functional sites.

In view of the above, in a preferred embodiment, substrate 150 comprises a plurality of functional sites capable of performing rotational handling operations on a microcomponent part presented thereto. In certain embodiments, substrate 150 may include further functional sites that provide further functionality in addition to rotational handling of a microcomponent part, such as one or more sites that provide translational handling of a microcomponent part. Any such embodiment is intended to be within the scope of the present invention.

According to one embodiment of the present invention, substrate 150 may be implemented within an integrated micro-chip. That is, a plurality of functional sites (or "microstages") may be included on a common integrated micro-chip. Such an integrated micro-chip may be utilized to provide the handling functionality offered by its plurality of functional sites for a micro-assembly process.

Most preferably, one or more micro-devices implemented on substrate 150 may be fabricated such that components of a micro-device are electrically isolated from each other. For instance, micro-device 400 of FIGS. 4A and 4B is preferably fabricated such that micro-gripper 407 is electrically isolated from microactuator 401, wherein micro-gripper 407 may be activated/deactivated independent of microactuator 401. Similarly, micro-device 500 of FIGS. 5A and 5B is preferably fabricated such that micro-gripper 501 is electrically isolated from microactuator 401, wherein micro-gripper 501 may be activated/deactivated independent of microactuator 401. As a further example, micro-device 700 of FIG. 7A is preferably fabricated such that microactuators 702A–D are electrically isolated from microactuators 703A–D, wherein microactuators 702A–D may be activated/deactivated independent of microactuators 703A–D. Similarly, micro-device 750 of FIG. 7B is preferably fabricated such that microactuators 753A–D are electrically isolated from microactuators 754A–D, wherein microactuators 753A–D may be activated/deactivated independent of microactuators 754A–D. As still another example, micro-device 900 of FIG. 9A is preferably fabricated such that microactuators 904A–D are electrically isolated from microactuators 905A–D, wherein microactuators 904A–D may be activated/deactivated independent of microactuators 905A–D.

An example of a fabrication process that enables such electrical isolation of components within a micro-device is disclosed in U.S. patent application Ser. No. 09/569,330 entitled "METHOD AND SYSTEM FOR SELF-REPLICATING MANUFACTURING STATIONS," U.S. patent application Ser. No. 09/616,500 entitled "SYSTEM AND METHOD FOR CONSTRAINING TOTALLY RELEASED MICROCOMPONENTS," concurrently filed U.S. patent application Ser. No. 10/033,011 entitled "SYSTEM AND METHOD FOR POSITIONAL MOVEMENT OF MICROCOMPONENTS," the disclosures of which have been incorporated herein by reference. Further, an example of a plurality of linear microactuators (e.g., SDAs) that may be independently controllable to provide independent movement (e.g., in different directions) is provided in concurrently filed U.S. patent application Ser. No. 10/033,011 entitled "SYSTEM AND METHOD FOR POSITIONAL MOVEMENT OF MICROCOMPONENTS." Of course, any suitable fabrication process now known or later discovered for implementing micro-devices with parts electrically isolated from each other may be utilized in embodiments of the present invention. Further, any micro-devices now known or later discovered that provide functionality for handling microcomponent parts, such as rotational functionality, are intended to be within the scope of the present invention, irrespective of the fabrication process utilized in fabricating such micro-devices.

According to one embodiment, substrates comprising one or more functional sites, such as exemplary substrate 150, may be implemented as pallets, such as the exemplary pallets described further in U.S. patent application Ser. No. 09/616,500 entitled "SYSTEM AND METHOD FOR CONSTRAIING TOTALLY RELEASED MICROCOMPONENTS," the disclosure of which has been incorporated herein by reference. The pallets may then be arranged as needed for a particular assembly process. For instance, a first pallet may comprise certain functional handling tasks and a second pallet may comprise further functional handling tasks, and a user may implement those pallets that comprise functional handling tasks needed for a particular assembly process. Accordingly, in one embodiment substrates comprising functional sites (micro-devices operable for handling microcomponent parts presented thereto) may be implemented as pallets for easier handling and greater flexibility in selecting any of a plurality of various pallets to be utilized in a given assembly process.

According to one embodiment a plurality of substrates each comprising functional sites may be arranged with their functional surfaces facing each other such that a microcomponent part may be handled by a site on one of the substrates and then presented from such site to a site on the facing wafer for further handling. For instance, substrate 150 may be arranged such that it faces an opposing substrate comprising functional sites thereon. Substrate 150 and/or the opposing substrate that it faces may be translated and/or rotated relative to each other such that various different functional sites of the opposing substrates may be aligned. For instance the substrates may be coupled to an actuator (or external robotic device) for translating and/or rotating the substrates relative to each other. An example of such an assembly process utilizing opposing substrates is further described in U.S. patent application Ser. No. 09/569,330 entitled "METHOD AND SYSTEM FOR SELF-REPLICATING MANUFACTURING STATIONS," the disclosure of which has been incorporated herein by reference.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A system for handling microcomponent parts, said system comprising:
    a substrate comprising a plurality of micro-devices that are each operable to perform a distinct rotational operation for rotating a microcomponent part presented thereto, wherein at least one of said plurality of micro-devices is operable to perform a rotational operation about an axis of rotation that is different than an axis of rotation about which another of said plurality of micro-devices is operable to perform a rotational operation, and wherein said at least one of said plurality of micro-devices is operable to hold said microcomponent part presented thereto above said substrate.

2. The system of claim 1 wherein said plurality of micro-devices are arranged on said substrate at distinct sites.

3. The system of claim 2 wherein said distinct sites are accessible to receive said microcomponent part.

4. The system of claim 1 wherein at least one of said plurality of micro-devices is operable to rotate a microcomponent part presented thereto about an axis of rotation that is parallel to said substrate.

5. The system of claim 4 wherein said at least one of said plurality of micro-devices is operable to perform bi-directional rotation of said microcomponent part presented thereto about said axis of rotation that is parallel to said substrate.

6. The system of claim 1 wherein at least one of said plurality of micro-devices is operable to rotate a microcomponent part presented thereto about an axis of rotation that is perpendicular to said substrate.

7. The system of claim 6 wherein at least one of said plurality of micro-devices is operable to perform bi-directional rotation of said microcomponent part presented thereto about said axis of rotation that is perpendicular to said substrate.

8. The system of claim 1 wherein a plane formed by an X axis and a Y axis is parallel to said substrate, a Z axis is perpendicular to said plane, and wherein said plurality of micro-devices are each operable to perform a distinct rotational operation of a type selected from the group consisting of:
rotation about said Z axis ($\theta$ rotation), rotation about said X axis ($\phi$ rotation), and rotation about said Y axis ($\psi$ rotation).

9. The system of claim 1 wherein a plane formed by an X axis and a Y axis is parallel to said substrate, a Z axis is perpendicular to said plane, and wherein said plurality of micro-devices are operable to perform rotation of a microcomponent part presented thereto about said Z axis ($\theta$ rotation), rotation of said microcomponent part presented thereto about said X axis ($\phi$ rotation), and rotation of said microcomponent part presented thereto about said Y axis ($\psi$ rotation).

10. The system of claim 9 wherein said plurality of micro-devices are operable to perform bi-directional rotation of said microcomponent part presented thereto about said Z axis ($\pm\theta$ rotation), about said X axis ($\pm\phi$ rotation), and about said Y axis ($\pm\psi$ rotation).

11. The system of claim 1 wherein at least one of said plurality of micro-devices is operable to grasp a microcomponent part presented thereto and rotate said microcomponent part about a rotational axis that is perpendicular to said substrate.

12. The system of claim 1 wherein said substrate further comprises at least one assembly site at which at least one microcomponent part presented to at least one of said plurality of micro-devices may be assembled with another part.

13. A system for handling microcomponent parts, said system comprising:
a substrate comprising a plurality of micro-devices, wherein a first of said plurality of micro-devices is operable to perform a first type of rotation of a microcomponent part presented thereto and a second of said plurality of micro-devices is operable to perform a second type of rotation of a microcomponent part presented thereto that is different than said first type of rotation, and wherein said substrate further comprises at least one assembly site at which at least one microcomponent part presented to at least one of said plurality of micro-devices may be assembled with another part.

14. The system of claim 13 wherein a plane formed by an X axis and a Y axis is parallel to said substrate, a Z axis is perpendicular to said plane, and wherein said first type of rotation and said second type of rotation each comprise at least one of the following:
rotation about said Z axis ($\theta$ rotation), rotation about said X axis ($\phi$ rotation), and rotation about said Y axis ($\psi$ rotation).

15. The system of claim 13 wherein a plane formed by an X axis and a Y axis is parallel to said substrate, a Z axis is perpendicular to said plane, and wherein said plurality of micro-devices are operable to perform rotation of a microcomponent part presented thereto about said Z axis ($\theta$ rotation), rotation of said microcomponent part presented thereto about said X axis ($\phi$ rotation), and rotation of said microcomponent part presented thereto about said Y axis ($\psi$ rotation).

16. The system of claim 15 wherein said plurality of micro-devices are operable to perform bi-directional rotation of said microcomponent part presented thereto about said Z axis ($\pm\theta$ rotation), about said X axis ($\pm\phi$ rotation), and about said Y axis ($\pm\psi$ rotation).

17. The system of claim 13 wherein at least one of said plurality of micro-devices is operable to rotate a microcomponent part presented thereto about an axis of rotation that is parallel to said substrate.

18. The system of claim 17 wherein said at least one of said plurality of micro-devices is operable to perform bi-directional rotation of said microcomponent part presented thereto about said axis of rotation that is parallel to said substrate.

19. The system of claim 13 wherein at least one of said plurality of micro-devices is operable to rotate a microcomponent part presented thereto about an axis of rotation that is perpendicular to said substrate.

20. The system of claim 19 wherein at least one of said plurality of micro-devices is operable to perform bi-directional rotation of said microcomponent part presented thereto about said axis of rotation that is perpendicular to said substrate.

21. A method for handling at least one microcomponent part for assembly with another part, said method comprising:
determining at least one of a plurality of distinct micro-devices included on a substrate to which said at least one microcomponent part should be presented for handling, wherein said plurality of distinct micro-devices are each operable to perform a rotational handling task on a microcomponent part presented thereto;
presenting said at least one microcomponent part to the determined at least one of a plurality of distinct micro-devices; and
activating the determined at least one of a plurality of distinct micro-devices to perform a rotational handling task on said at least one microcomponent part.

22. The method of claim 21 wherein said rotational handling task orients said at least one microcomponent part for assembly with said another part.

23. The method of claim 21 wherein at least one of said plurality of distinct micro-devices is operable to rotate a microcomponent part presented thereto about an axis of rotation that is parallel to said substrate.

24. The method of claim 21 wherein at least one of said plurality of distinct micro-devices is operable to rotate a microcomponent part presented thereto about an axis of rotation that is perpendicular to said substrate.

25. The method of claim 21 wherein said plurality of distinct micro-devices includes at least one micro-device that is operable to rotate a microcomponent part presented thereto about an axis of rotation that is parallel to said substrate, and wherein said plurality of distinct micro-devices further includes at least one micro-device that is operable to rotate a microcomponent part presented thereto about an axis of rotation that is perpendicular to said substrate.

26. The method of claim 21 wherein said determining step comprises determining a plurality of said plurality of distinct micro-devices included on said substrate to which said at least one microcomponent part should be presented for handling.

27. The method of claim 21 further comprising:
retrieving said at least one microcomponent part from the determined at least one of a plurality of distinct micro-devices; and
assembling said at least one microcomponent part with said another part.

28. The method of claim 21 further comprising:
determining at least one rotational handling task needed for an assembly process for assembling said at least one microcomponent part with said another part.

29. The method of claim 28 further comprising:
including on said substrate said plurality of distinct micro-devices, wherein at least one of said plurality of distinct micro-devices is operable to perform the determined at least one rotational handling task needed for said assembly process.

30. The method of claim 21 wherein said substrate further comprises at least one distinct micro-device that is operable to perform a translational handling task on a microcomponent part presented thereto, said method further comprising:
determining whether said at least one microcomponent part should be presented to said at least one distinct micro-device that is operable to perform a translational handling task.

31. A method for forming a micro-system for handling at least one microcomponent part for assembly with another part, said method comprising:
determining at least one rotational handling task needed for an assembly process for assembling said at least one microcomponent part with said another part; and
including on a substrate a plurality of distinct micro-devices that are each operable to perform a rotational handling task on a microcomponent part presented thereto, wherein at least one of said plurality of distinct micro-devices is operable to perform the determined at least one rotational handling task needed for said assembly process.

32. The method of claim 31 wherein said determining step comprises determining a plurality of rotational handling tasks needed for said assembly process.

33. The method of claim 31 wherein said plurality of rotational handling tasks comprise at least two different types of rotational handling tasks, wherein a first type of said at least two different types includes rotating said at least one microcomponent part about a first axis of rotation and wherein a second type of said at least two different types includes rotating said at least one microcomponent part about a second axis of rotation that is different than said first axis of rotation.

34. The method of claim 33 wherein said including step comprises including on said substrate at least one micro-device that is operable to rotate a microcomponent part presented thereto about said first axis of rotation and including on said substrate at least one micro-device that is operable to rotate a microcomponent part presented thereto about said second axis of rotation.

* * * * *